United States Patent [19]

Andresen

[11] Patent Number: 5,097,234
[45] Date of Patent: Mar. 17, 1992

[54] PASSIVE IMPEDANCE MATCHING DEVICE

[76] Inventor: Jack S. Andresen, 1394 Willow Rd., Menlo Park, Calif. 94025-1598

[21] Appl. No.: 581,698

[22] Filed: Sep. 13, 1990

[51] Int. Cl.[5] .......................... H01P 5/16; H03H 7/48
[52] U.S. Cl. ..................................... 333/119; 333/131
[58] Field of Search ................................ 333/119, 131

[56] References Cited

U.S. PATENT DOCUMENTS 3,181,087  4/1965  Almering ............................ 333/119
4,419,636  12/1983  Yu ...................................... 333/131

Primary Examiner—Paul Gensler
Attorney, Agent, or Firm—Jim Zegeer

[57] ABSTRACT

A passive impedance matching device incorporates a pair of power splitters, each having a transformer core with a center tapped winding shunted by a resistance having a predetermined value. The power splitter windings have their center taps connected to the input terminals. The arrangement creates a virtual ground and thus avoids the need to create an unbalanced signal. By cascading stages the input signal can be split any number of times. Unused outputs are terminated with their characteristic impedance.

2 Claims, 2 Drawing Sheets

PASSIVE IMPEDANCE MATCHING DEVICE

BACKGROUND AND BRIEF DESCRIPTION OF THE INVENTION

The present invention is directed to improvements in passive impedance matching devices for coupling signals from a source, such as a host computer, to a plurality of utilization devices, such as other computers, terminals or peripheral devices. More particularly, the invention relates to a device in which a host computer controls a network or system of a plurality of remote computers or terminals (e.g., the host initiates and the terminals do not talk to each other.)

Computer networking is a very useful system for allowing a host computer to communicate with a plurality of terminals. Active and passive coupling systems and devices are widely used in the art; the present invention is a passive coupling device. Most commercial passive coupling devices do not properly impedance match over wide frequency ranges and those that do are complex and relatively expensive.

The object of the present invention is to provide an improved passive impedance matching device which is economical and effective over a wide frequency range.

A passive impedance matching device according to the invention incorporates a power splitter comprised of a center tapped bifilar wound coil on a core and shunted by a resistance or impedance having a predetermined value. A pair of these power splitters have their center taps connected to commonly receive input signals from a host computer, for example. This arrangement creates a virtual ground and thus avoids the need to create an unbalanced (single sided) signal. By cascading stages, the input signal can be split and impedance matched may times and be operative over a wide frequency range. Where only a particular number of outputs, less than the number of outputs available by cascading, are used, the unused outputs are terminated with their characteristic impedance.

DESCRIPTION OF THE DRAWINGS

The above and other objects, advantages and features of the invention will become more apparent when considered with the following specification and accompanying drawings wherein.

DETAILED DESCRIPTION OF THE INVENTION

Figure 1:
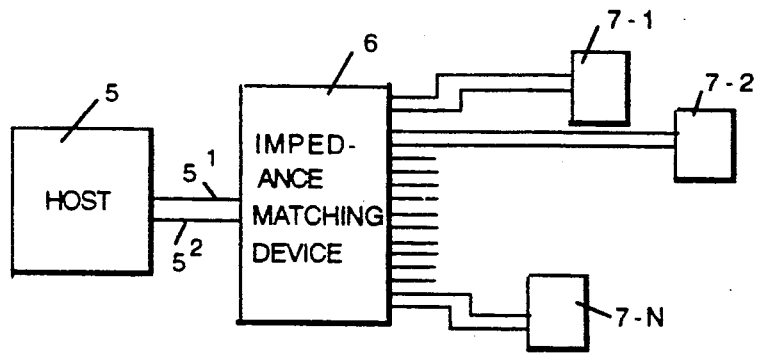
FIG. 1 is a block diagram of a host-computer system, coupled by a passive impedance matching system of this invention to a plurality of terminals or utilization devices.
Figure 2:
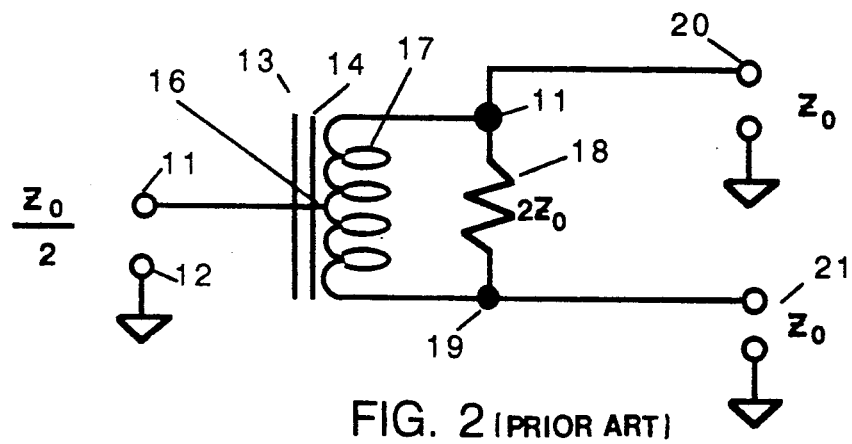
FIG. 2 is a circuit diagram of a power splitter incorporating the invention.

Referring now to FIG. 1, a host computer 5 is connected by the passive impedance matching device 6 of this invention to a plurality of utilization devices 7-1, 7-2, ... 7-n, which may be terminal devices, peripherals such as printers, modems etc. Passive impedance matching device 6 is operative over a wide frequency range. The basic technology of the passive impedance matching device of this invention is the power splitter illustrated in FIG. 2. As shown, a signal is applied between input terminal 11 and ground 12 and has an impedance $Z_o/2$. A well coupled bifilar wound device 13 has a core 14. Winding 15 has a center tap or mid point 16 which is connected to input terminal 11. A first end 17 of winding 15 is connected to the upper end of resistor or impedance 18 (having, in this instance, a value of $2Z_o$) and a second end 19 connected to the opposite end of resistor 18. A first pair of output terminals 20 (one of the output terminals being ground) supplies the signals to a first utilization or load device and a second pair of output terminals 21 supplies a second utilization device. With the well coupled bifilar wound devices 13, the impedances are as shown over a wide frequency range. The input signal is coupled by a coaxial cable connector and both outputs are coupled to utilization devices by coaxial cable connectors. In the preferred embodiments described below, twinax cabling is used.

Figure 3:
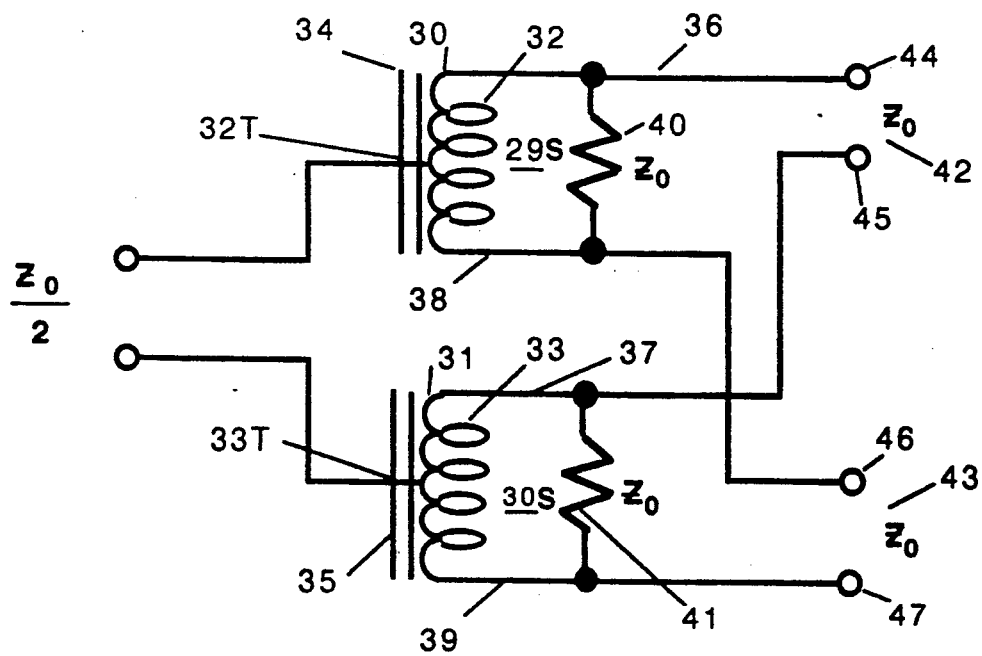
FIG. 3 is a circuit diagram of a preferred embodiment of the invention with a virtual ground.

By creating a virtual ground, as shown in FIG. 3, there is no need to create an unbalanced (single sided) signal. The input signal to a pair of power splitters 295 and 305, each of which includes a well coupled bifilar wound device 30 and 31, respectively, having windings 32 and 33, respectively on cores 34 and 35. Each winding has a center tap 32t and 33t and first 36 and 37 and second 38 and 39 ends with a shunt impedance or resistance 40 and 41 between the respective first and second ends. A pair of output load device terminal paris 42 and 43 are connected as follows: a first terminal 44 is connected to the first end 36 of winding 32 and a second terminal 45 is connected to the first end 37 of winding 33. Similarly, Output load connector 46 is connected to second end 38 of winding 32 and second terminal 47 is connected to the second end of 39 of winding 33. In FIG. 3, note that the shunt resistances 40 and 41 are $Z_o$ whereas in the case of FIG. 1 the shunt resistance is $2Z_o$. this only works with balanced signals.

Figure 4:
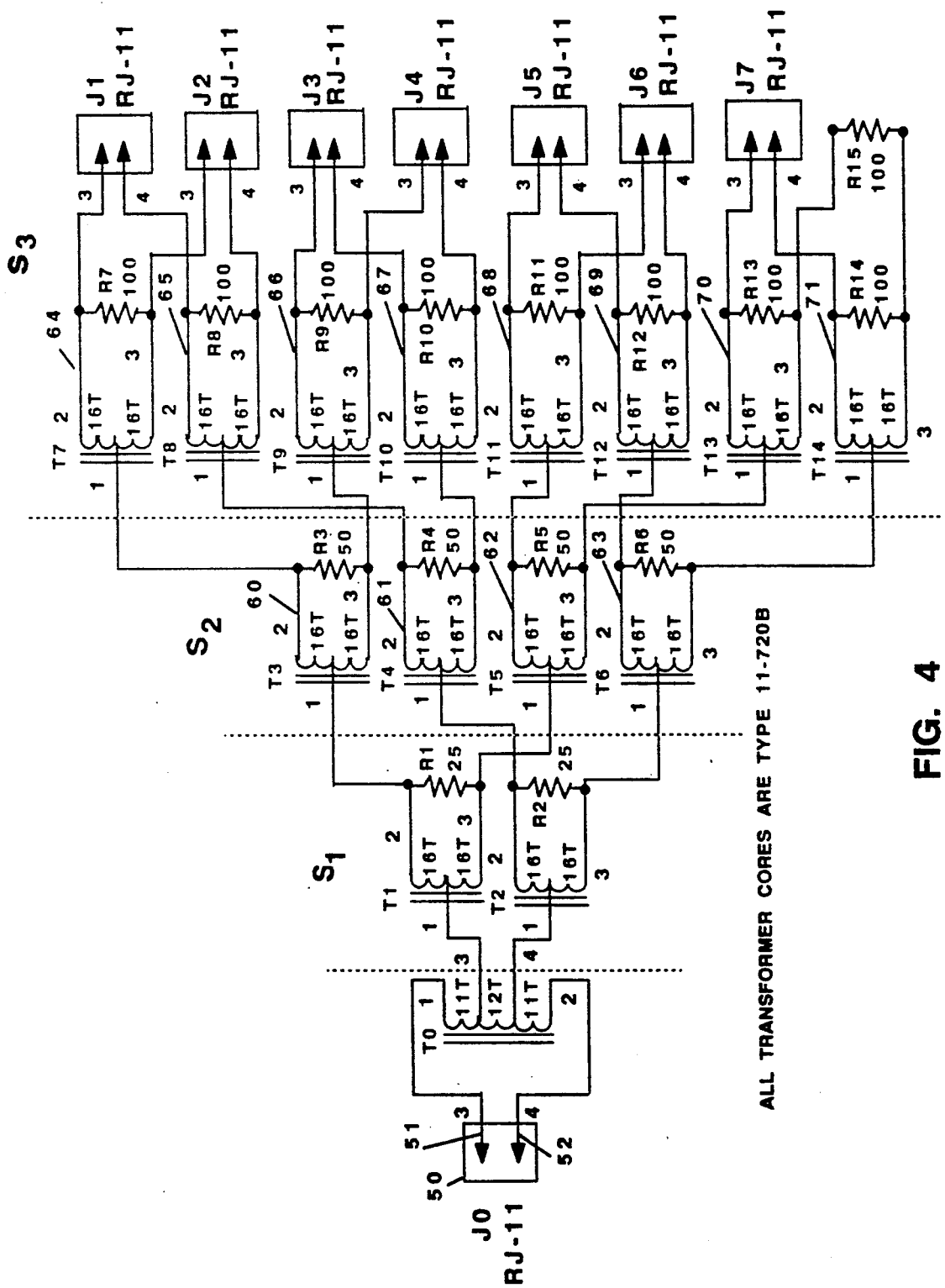
FIG. 4 is a detailed circuit diagram of a preferred embodiment of the invention for the host computer illustrated in FIG. 1.

Referring now to FIG. 4, the virtual ground disclosed in FIG. 3 is combined with a triple cascading of stages yielding an eight way split. There obviously could be more cascading of stages if desired. Since some commercial systems (IBM, for example) allow only seven terminals per port (address limited) the terminal on power splitter 71 is terminated in its characteristic impedance (R15).

In FIG. 4, input transformer $T_o$, which has an input impedance ratio of 8 to 1, is connected to connector jack 50, which is connected to a source of signals such as computer 5. Terminal connector 51 is coupled to input terminal #1 of transformer $T_o$ and terminal connector 52 is connected to input terminal #2 of transformer $T_o$. Each of the winding for transformers $T_o$ through $T_{14}$ has the number of turns between taps as indicated in the exemplary embodiment of FIG. 4. These are exemplary, as are the resistance values given for resistors R1–R15. In addition all transformer cores are type 11-720B and all transformer windings are well coupled bifilar wound.

The first stage S1 is connected in the same way as illustrated for FIG. 3. In the second stage S2, there are four power splitters 60, 61, 62 and 63, and in the third stage there are eight power splitters 64 to 71, with a center tapped well coupled bifilar wound device and shunt resistance in each power splitter. Further cascading of stages is possible, the next stage yielding a sixteen way split, and so on.

While there has been shown and described preferred embodiments of the invention, it will be clear that these have been by way of example and that other embodiments and modifications of the invention will be apparent to those skilled in the art.

What is claimed is:

1. A passive impedance matching device for coupling a signal from a pair of input terminals to a plurality of pairs of device terminals, each pair of device terminals having first and second connections, comprising a pair of power splitters, each power splitter having a bifilar wound device, each bifilar wound device having a core, a winding on said core, said winding having first and second ends and a center tap, a shunt impedance of predetermined value connected between said first and second ends, respectively, means connecting said centertap of a first of said bifilar windings to one of said pair of input terminals and the other of said pair of input terminals to the centertap of the winding of the other of said bifilar windings, means connecting a first device terminal connection of one of said plurality of pairs to said first end of one of said windings, means connecting a second device terminal connection of said one of a plurality of pairs to said first end of a second one of said windings, and means connecting a first device terminal connection of a further of said plurality of pairs to said second end of said one of said windings, and means connecting a second device terminal connection of said further of said plurality of pairs to said second end of said second one of said windings, respectively.

2. The passive impedance matching device defined in claim 1 wherein said pair of bifilar wound devices and shunt impedances constitute a first stage, and including means to cascade further stages thereon to increase the number of output load devive terminals in a geometric progression with each successive stage.

* * * * *